United States Patent
Nakagawa et al.

(10) Patent No.: US 9,577,082 B2
(45) Date of Patent: Feb. 21, 2017

(54) SEMICONDUCTOR DEVICE

(71) Applicant: Toyota Jidosha Kabushiki Kaisha, Toyota-shi, Aichi-ken (JP)

(72) Inventors: Hidehiro Nakagawa, Toyota (JP); Hiroshi Hata, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/188,574

(22) Filed: Jun. 21, 2016

(65) Prior Publication Data

US 2017/0025521 A1    Jan. 26, 2017

(30) Foreign Application Priority Data

Jul. 21, 2015    (JP) .................. 2015-144325

(51) Int. Cl.
*H01L 29/73*        (2006.01)
*H01L 29/739*      (2006.01)
*H01L 29/10*        (2006.01)
*H01L 29/16*        (2006.01)
*H01L 29/49*        (2006.01)
*H01L 29/51*        (2006.01)

(52) U.S. Cl.
CPC ...... *H01L 29/7397* (2013.01); *H01L 29/1095* (2013.01); *H01L 29/1608* (2013.01); *H01L 29/4916* (2013.01); *H01L 29/51* (2013.01)

(58) Field of Classification Search
CPC . H01L 29/73; H01L 29/7395; H01L 29/7397; H01L 29/06; H01L 29/0696; H01L 29/10; H01L 29/1095; H01L 29/66; H01L 29/66333

USPC ......................................................... 257/139
See application file for complete search history.

(56) References Cited

U.S. PATENT DOCUMENTS

| | | | |
|---|---|---|---|
| 2010/0038675 A1 | 2/2010 | Yoshikawa | |
| 2016/0172464 A1* | 6/2016 | Grivna | H01L 29/66348 |
| | | | 257/139 |

FOREIGN PATENT DOCUMENTS

| | | |
|---|---|---|
| JP | 2002-314081 A | 10/2002 |
| JP | 2007-110002 A | 4/2007 |
| JP | 2010-045245 A | 2/2010 |
| JP | 2010-232627 A | 10/2010 |
| JP | 2014-192351 A | 10/2014 |

* cited by examiner

*Primary Examiner* — Monica D Harrison
(74) *Attorney, Agent, or Firm* — Dinsmore & Shohl LLP

(57) ABSTRACT

The semiconductor device includes: a plurality of interlayer insulation films, each interlayer insulation film covering a front surface of a corresponding one of the gate electrodes and protruding from the front surface of the semiconductor substrate; the first metal film covering the front surface of the semiconductor substrate and plurality of the interlayer insulation films; and the protective insulation film covering a part of the first metal film. In a cross-section traversing the plurality of trenches, the end of the protective insulation film is above one of the interlayer insulation films, and a width of the one of the interlayer insulation films that is below the end of the protective insulation film is wider than widths of other interlayer insulation films.

3 Claims, 4 Drawing Sheets

SEMICONDUCTOR DEVICE

CROSS-REFERENCE TO RELATED APPLICATION

This application claims priority to Japanese Patent Application No. 2015-144325 filed on Jul. 21, 2015, the entire contents of which are hereby incorporated by reference into the present application.

TECHNICAL FIELD

The present application relates to a semiconductor device.

DESCRIPTION OF RELATED ART

A semiconductor device disclosed in Japanese Patent Application Publication No. 2010-045245 includes a semiconductor substrate, a plurality of trenches provided abreast on a front surface of the semiconductor substrate, gate insulation films, each of which is covering an inner surface of corresponding one of the trenches, and gate electrodes, each of which is provided inside the corresponding one of the trenches and insulated from the semiconductor substrate by the gate insulation film provided inside the corresponding one of the trenches. Further, the semiconductor device disclosed in Japanese Patent Application Publication No. 2010-045245 includes interlayer insulation films that cover front surfaces of the gate electrodes and protruding from the front surface of the semiconductor substrate, and a metal film covering the front surface of the semiconductor substrate and the plurality of interlayer insulation films. The metal film spreads over the plurality of interlayer insulation films, and covers the surface of the semiconductor substrate exposed between the adjacent interlayer insulation films.

In the semiconductor device disclosed in Japanese Patent Application Publication No. 2010-045245, the interlayer insulation films protrude from the front surface of the semiconductor substrate, so a plurality of step portions is generated on a surface of the metal film covering those interlayer insulation films. The step portions of the metal film are provided at portions covering ends of the interlayer insulation films. Stress is more likely to be accumulated in the step portions of the metal film as compared to other portions thereof.

SUMMARY

In addition to the above configuration of Japanese Patent Application Publication No. 2010-045245, a semiconductor device in some cases is provided with a following configuration. That is, the semiconductor device may be provided with a protective insulation film that covers a part of the metal film. For example, a protective insulation film may be provided at a peripheral portion of the front surface of the semiconductor substrate, and this protective insulation film may cover a part of the metal film.

In the above semiconductor device, an end of the protective insulation film is a border between a portion of the metal film covered by the protective insulation film and a portion of the metal film that is not, so a stress distribution in the metal film changes locally therein beneath the end. Thus, a high stress is more likely to be generated in the metal film beneath the end of the protective insulation film. If the above semiconductor device operates and generates heat, the heat causes thermal expansion of both the metal film and the protective insulation film. At this occasion, the metal film beneath the end of the protective insulation film has a greater thermal stress generated therein than other portions of the metal film.

The end of the protective insulation film includes a portion extending along a longitudinal direction of the trenches or the interlayer insulation films, and a portion extending to traverse across the plurality of trenches. It has been found that the thermal stress becomes problematic especially in the former portion. Especially, it has been found that a crack is more likely to be generated in the metal film if the end of the protective insulation film extending along the longitudinal direction is located at a position overlapping one of the step portions of the metal film extending in the longitudinal direction.

In some embodiments, the generation of cracks in the metal film is suppressed by displaying the position of the end of the protective insulation film extending along the longitudinal direction and the positions of the step portions of the metal film extending in the same direction from each other in a direction traversing across the plurality of trenches. However, it is difficult to adjust the position of the end of the protective insulation film to be in the aforementioned positional relationship while maintaining efficient yield. There are cases where the position of the end of the protective insulation film overlaps with the position of one of the step portions of the metal film.

There may be several methods for configuring the end of the protective insulation film not to overlap with the position of one of the step portions of the metal film. For example, a width (width in a direction traversing the plurality of trenches) of the interlayer insulation films may be widened. In so doing, a width of flat portions of the metal film covering upper portions of the interlayer insulation films becomes wider, and a relationship in which the end of the protective insulation film is positioned on one of the flat portions is more easily obtained. Alternatively, a width between the adjacent trenches may be widened. In this case, the width of the metal film extending flat between the adjacent trenches becomes wider, and a relationship in which the end of the protective insulation film is positioned on the flat portion is more easily obtained.

However, in either of the cases a semiconductor device performance will be deteriorated. In the former case, a contact between the metal film and the semiconductor substrate is reduced, and an ON resistance is increased. In the latter case, a number of channels (inverted layer) formed per unit area is reduced, and likewise the ON resistance is increased.

In the present teachings, a semiconductor structure that does not reduce the semiconductor device performance, and disposes the end of the protective insulation film to be less likely overlap the step portions of the metal film, is disclosed.

A semiconductor device disclosed herein comprises: a semiconductor substrate; a plurality of trenches provided abreast on a front surface of the semiconductor substrate; a plurality of gate insulation films, each gate insulation film covering an inner surface of a corresponding one of the trenches; a plurality of gate electrodes, each gate electrode being provided in the corresponding trench and insulated from the semiconductor substrate by a corresponding one of the gate insulation films; a plurality of interlayer insulation films, each interlayer insulation film covering a front surface of a corresponding one of the gate electrodes and protruding from the front surface of the semiconductor substrate; a metal film covering the front surface of the semiconductor substrate and plurality of the interlayer insulation films; and a protective insulation film covering a part of the metal film, wherein in a cross-section traversing the plurality of trenches, an end of the protective insulation film is above one of the interlayer insulation films, and a width of the one of the interlayer insulation films that is below the end of the protective insulation film is wider than widths of other interlayer insulation films.

In the above semiconductor device, the end of the protective insulation film is positioned above one of the interlayer insulation films, and the width of the one of the interlayer insulation films that is below the end of the protective insulation film is wider than the widths of other interlayer insulation films. According to such a configuration, a length that can be seen in a cross sectional view between ends of the interlayer insulation film positioned under the end of the protective insulation film is wide, so a length between edges of a step portion formed at portions covering both ends of the interlayer insulation film in the metal film covering the interlayer insulation film becomes larger. Due to this, it becomes easy to locate the end of the protective insulation film on a flat portion created on an inner side between the edges of the step portion of the metal film upon forming the protective insulation film covering the metal film. That is, it becomes easy to provide the protective insulation film such that the end of the protective insulation film does not overlap the step portion of the metal film. As a result of this, yield in the production of semiconductor devise can be improved. Further, since only the width of the interlayer insulation film located under the end of the protective insulation film needs to be adjusted, the semiconductor device performance would not be deteriorated.

DETAILED DESCRIPTION

First Embodiment

Figure 1:
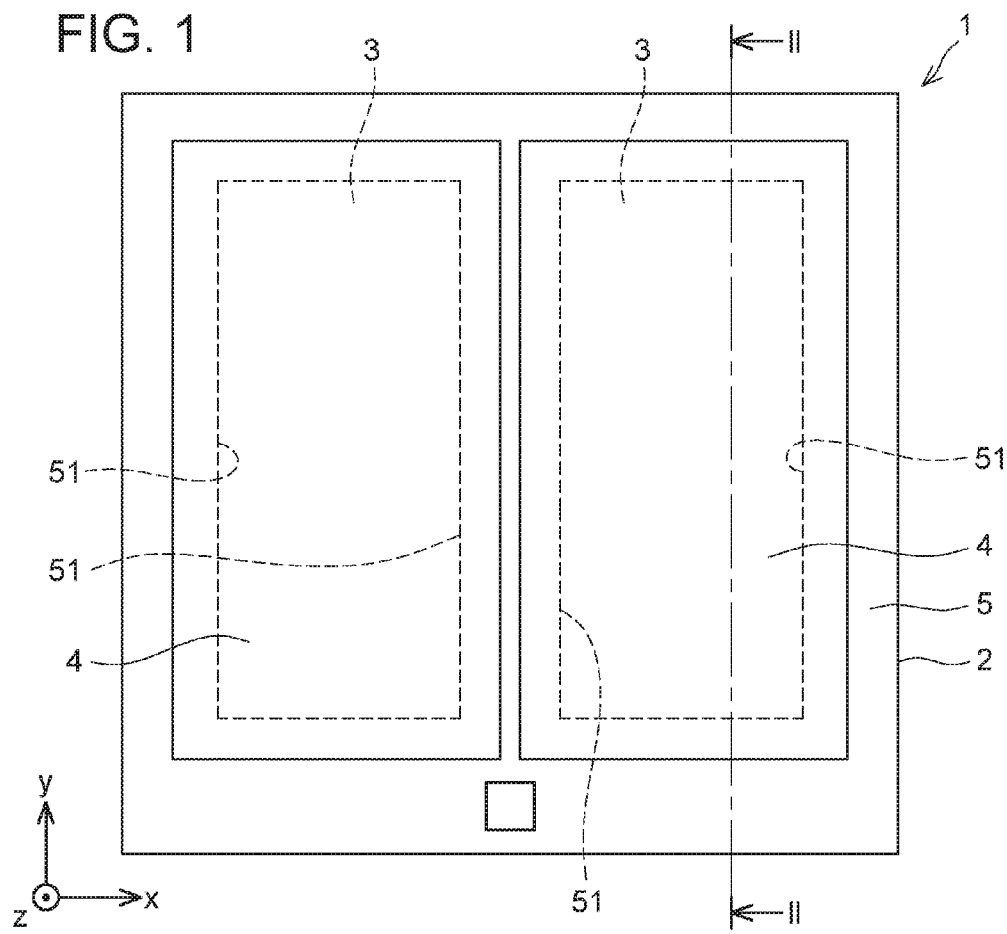
FIG. 1 is a top view of a semiconductor device of an embodiment.
Figure 2:
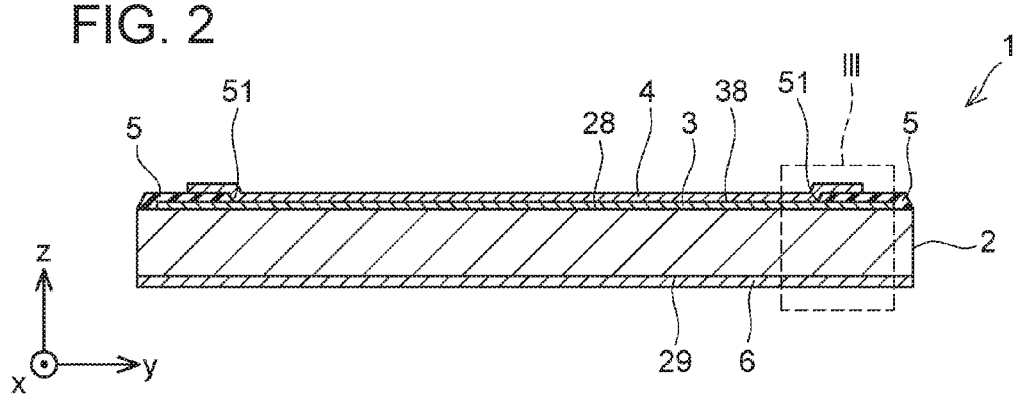
FIG. 2 is a II-II cross sectional view of FIG. 1. It views a cross section extending along a direction traversing across a plurality of trenches (y direction). However, depiction of a semiconductor element in a semiconductor substrate is omitted.

As shown in FIGS. 1 and 2, a semiconductor of a first embodiment comprises a semiconductor substrate 2, first metal films 3 provided on a front surface (upper surface) 28 of the semiconductor substrate 2, second metal films 4, each of which is provided on a front surface 38 of the corresponding first metal film 3, and a rear surface metal film 6 provided on a rear surface (bottom surface) 29 of the semiconductor substrate 2. Further, the semiconductor device 1 comprises a protective insulation film 5 provided around the first metal films 3 and the second metal films 4. The protective insulation film 5 is provided over end portions and a center portion in an x direction of the semiconductor substrate 2.

The semiconductor substrate 2 is shaped rectangular as seen along a front view. The semiconductor substrate 2 is for example formed of silicon (Si), silicon carbide (SiC), and the like. Semiconductor elements are provided in the semiconductor substrate 2. As the semiconductor elements, for example, an IGBT (Insulated Gate Bipolar Transistor) and a MOSFET (Metal Oxide Semiconductor Field Effect Transistor) may be exemplified. In the present embodiment, IGBTs are provided in the semiconductor substrate 2.

Figure 3:
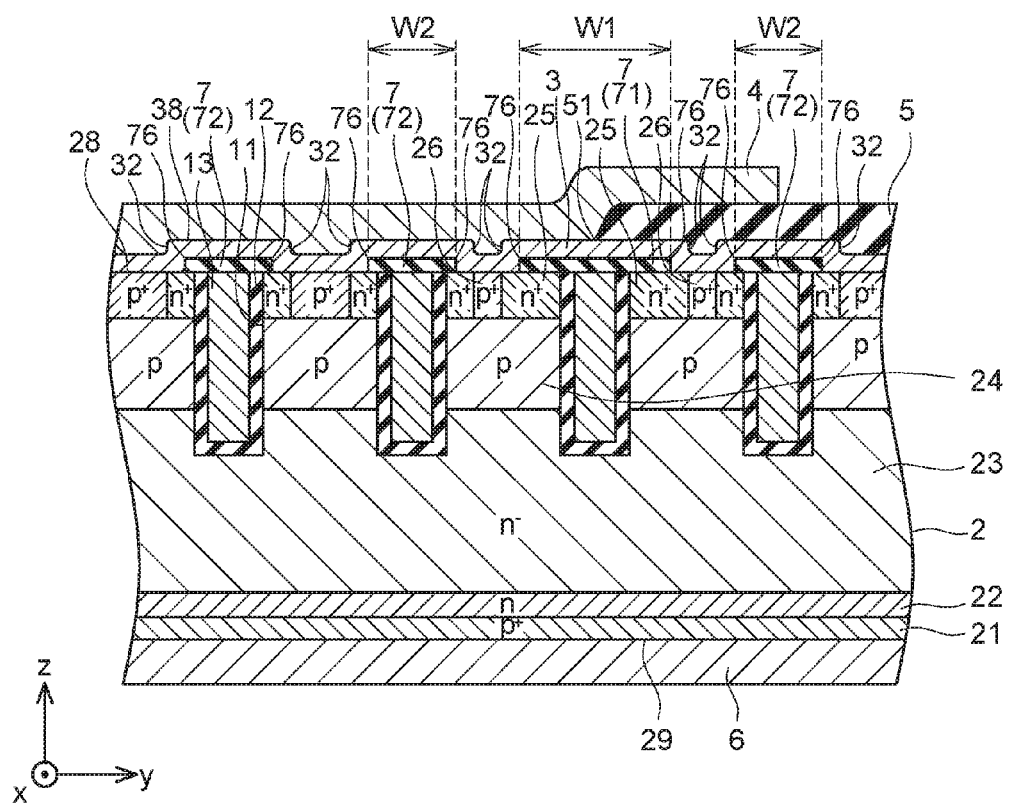
FIG. 3 is an enlarged view of a primary part III of FIG. 2.

As shown in FIG. 3, the semiconductor substrate 2 comprises, from a rear surface 29 side towards a front surface 28 side, in this order, a collector region 21, a buffer region 22, a drift region 23, a body region 24, emitter regions 25, and contact regions 26.

The collector region 21 is a p-type region. The collector region 21 has a high impurity concentration. The collector region 21 is provided on a rear surface side of the buffer region 22. The collector region 21 is provided in a range that is exposed on the rear surface 29 of the semiconductor substrate 2. The collector region 21 is electrically connected to the rear surface metal film 6.

The buffer region 22 is an n-type region. The buffer region 22 is provided on a front surface side of the collector region 21. The buffer region 22 is provided between the collector region 21 and the drift region 23.

The drift region 23 is an n-type region. An impurity concentration of the drift region 23 is lower than the impurity concentration of the buffer region 22. The drift region 23 is provided on the front surface side of the buffer region 22. The drift region 23 is provided between the buffer region 22 and the body region 24.

The body region 24 is a p-type region. An impurity concentration of the body region 24 is lower than the impurity concentration of the collector region 21. The body region 24 is provided on the front surface side of the drift region 23. The body region 24 is provided between the drift region 23 and the emitter regions 25 as well as the contact regions 26. The body region 24 is provided in a range making contact with trenches 11.

The emitter regions 25 are n-type regions. An impurity concentration of the emitter regions 25 is higher than the impurity concentration of the drift region 23. The emitter regions 25 are provided on the front surface side of the body region 24. The emitter regions 25 are provided in a range making contact with the trenches 11. The emitter regions 25 are provided in an island shape in a range exposed on the front surface 28 of the semiconductor substrate 2. The emitter regions 25 are electrically connected to their corresponding first metal film 3.

The contact regions 26 are p-type regions. An impurity concentration of the contact regions 26 is higher than the impurity concentration of the body region 24. The contact regions 26 are provided on the front surface side of the body region 24. The contact regions 26 are provided at positions different from the emitter regions 25. The contact regions 26 are provided in an island shape in a range exposed on the front surface 28 of the semiconductor substrate 2. The contact regions 26 are electrically connected to their corresponding first metal film 3.

Further, the semiconductor device 1 comprises the plurality of trenches 11 provided in the semiconductor substrate 2, a plurality of gate insulation films 12, a plurality of gate electrodes 13, and a plurality of interlayer insulation films 7.

The trenches 11 extend from the front surface 28 of the semiconductor substrate 2 towards the rear surface 29 side (in a z direction). The trenches 11 extend from the front surface 28 of the semiconductor substrate 2 to a depth reaching the drift region 23 while penetrating the emitter regions 25 and the body region 24. The plurality of trenches 11 is provided abreast in the front surface 28 of the semiconductor substrate 2. The plurality of trenches 11 is provided with intervals in a lateral direction (y direction). A gate insulation film 12 is provided on an inner surface of each trench 11. A gate electrode 13 is provided inside each trench 11.

The gate insulation films 12 are formed for example from silicon oxide ($SiO_2$). The gate insulation films 12 cover the inner surfaces of the trenches 11. Each gate insulation film 12 is arranged between the semiconductor substrate 2 and its corresponding gate electrode 13.

The gate electrodes 13 are for example formed of polysilicon (Poly Si). The gate electrodes 13 are provided within the trenches 11 on inner sides of the gate insulation films 12. The gate electrodes 13 are insulated from the semiconductor substrate 2 by their corresponding gate insulation films 12. The interlayer insulation films 7 are provided respectively over the gate electrodes 13.

The interlayer insulation films 7 are formed for example from silicon oxide (SiO2). The interlayer insulation films 7 respectively cover front surfaces of the gate electrodes 13. The interlayer insulation films 7 insulate their corresponding gate electrodes 13 and the first metal film 3. The interlayer insulation films 7 project out from the front surface 28 of the semiconductor substrate 2. The plurality of interlayer insulation films 7 is provided abreast on the front surface 28 of the semiconductor substrate 2. The plurality of interlayer insulation films 7 is provided with intervals in the lateral direction (y direction). One interlayer insulation film 7 is provided for each of the gate electrodes 13. One interlayer insulation film 7 covers the front surface of one corresponding gate electrode 13. An interlayer insulation film 7 having a wide width and an interlayer insulation film 7 having a narrow width are included among the plurality of interlayer insulation films 7. The width refers to a dimension along a direction along which the plurality of trenches 11 is aligned abreast (y direction). Among the plurality of interlayer insulation films 7, the interlayer insulation film 7 having the wide width may be termed a wide-width interlayer insulation film 71, and other interlayer insulation films 7 may be termed narrow-width interlayer insulation films 72. Each of the first metal films 3 is provided in a range that spreads over its corresponding plurality of interlayer insulation films 7.

The first metal films 3 have conductivity. The first metal films 3 are formed for example of aluminum (Al). As shown in FIG. 1, in the present embodiment, two first metal films 3 are provided adjacent each other. As shown in FIG. 3, the first metal films 3 cover the front surface 28 of the semiconductor substrate 2 and the plurality of interlayer insulation films 7. Each first metal film 3 covers its corresponding interlayer insulation films 7, as a result of which step portions 32 are generated in the first metal film 3. A plurality of step portions 32 is generated in each first metal film 3. Each step portion 32 is provided at a portion where an end 76 of an interlayer insulation film 7 is covered. Stress is more likely to accumulate at the step portions 32 than any other portions. The protective insulation film 5 is provided on the first metal film 3.

The protective insulation film 5 is formed of resin, and is an insulator. The protective insulation film 5 is formed for example of polyimide. The protective insulation film 5 covers a part of each first metal film 3. An end 51 of the protective insulation film 5 is positioned between each first metal film 3 and its corresponding second metal film 4. The first metal film 3 includes a portion that is covered by the protective insulation film 5 and a portion that is not. At the position of the end 51 of the protective insulation film 5, the first metal film 3 and the second metal film 4 make contact, the first metal film 3 and the protective insulation film 5 make contact, and the second metal film 4 and the protective insulation film 5 make contact with each other. A linear expansion coefficient of the first metal film 3, a linear expansion coefficient of the protective insulation film 5 and a linear expansion coefficient of the second metal film 4 differ from each other.

When a cross section of FIG. 3 is seen (cross section extending along the direction traversing the plurality of trenches (y direction)), the end 51 of the protective insulation film 5 is positioned above one of the interlayer insulation films 7 (wide-width interlayer insulation film 71) in an up and down direction (z direction) of the semiconductor substrate 2. The end 51 of the protective insulation film 5 and the wide-width interlayer insulation film 71 overlap each other. A width w1 of the interlayer insulation film 7 (wide-width interlayer insulation film 71) positioned under the end 51 of the protective insulation film 5 in the y direction is wider than a width w2 of other interlayer insulation films 7 (narrow-width interlayer insulation films 72) in the y direction. Further, the end 51 of the protective insulation film 5 is not overlapped with any of the ends 76 of the interlayer insulation films 7. The end 51 of the protective insulation film 5 is not overlapped with the step portions 32 of the first metal film 3. In forming the protective insulation film 5 covering the first metal film 3, the formation is carried out so that the end 51 of the protective insulation film 5 is positioned above the specific interlayer insulation film 7 (wide-width interlayer insulation film 71). In some embodiments, the protective insulation film 5 is formed so that the end 51 of the protective insulation film 5 is positioned above a portion distant from the end 76 of the wide-width interlayer insulation film 71 (at the center portion of the wide-width interlayer insulation film 71).

The second metal films 4 have conductivity. The second metal films 4 are formed for example of nickel (Ni). As shown in FIG. 1, in the present embodiment, two second metal films 4 are provided adjacent each other. As shown in FIG. 3, each second metal film 4 covers the portion of the corresponding first metal film 3 not covered by the protective insulation film 5, and the protective insulation film 5. The second metal film 4 covers the end 51 of the protective insulation film 5. Terminals are connected to a front surface of each second metal film 4 via solder (omitted from drawings).

The rear surface metal film 6 is formed by one or more metal selected for example from aluminum (Al), nickel (Ni), gold (Au), and the like. The rear surface metal film 6 covers the rear surface 29 of the semiconductor substrate 2. Terminals are connected to a rear surface of the rear surface metal film 6 via solder (omitted from drawings).

When the semiconductor device 1 having the above configuration is operated and heat is generated, the heat causes all of the first metal films 3, the protective insulation film 5, and the second metal films 4 to thermally expand. At this occasion, since the ends 51 of the protective insulation film 5 are being the boundary between the portion where each first metal film 3 is covered by the protective insulation film 5 and the portion that is not, so a stress distribution in the first metal films 3 under the ends 51 changes locally, as a result of which a large stress is generated.

Further, the first metal films 3, the protective insulation film 5, and the second metal films 4 thermally expand at different rates due to their differences in the linear expansion coefficients. In so doing, stress is generated by the difference in the thermal expansion rates of the first metal films 3, the protective insulation film 5, and the second metal films 4. At this occasion, at the portions where the first metal films 3, the protective insulation film 5, and the second metal films 4 make contact with each other, that is, at the positions of the ends 51 of the protective insulation film 5, larger stress than other portions is generated.

As is clear from the above description, in the semiconductor device 1 disclosed herein, the end 51 of the protective insulation film 5 is positioned above the specific interlayer insulation film 7, and the width w1 of the specific interlayer insulation film 7 positioned under the end 51 of the protective insulation film 5 is wider than the width w2 of the other interlayer insulation films 7. According to this configuration, in the cross sectional view, the length between edges of the end 76 of the specific interlayer insulation film 7 located under the end 51 of the protective insulation film 5 is large, so a length between edges of the step portion 32 of the first metal film 3 covering this end 76 of the interlayer insulation film 7 becomes greater. Due to this, it becomes easier to position the end 51 of the protective insulation film 5 above a portion between the edges of the step portion 32 of the first metal film upon forming the protective insulation film 5 that covers the first metal film 3. That is, it becomes easier to position the end 51 of the protective insulation film 5 at a position that would not overlap with the step portions 32 of the first metal film 3. Due to this, it becomes easier to form the protective insulation film 5 while ensuring that the portion where large stress is generated (the end 51 of the protective insulation film 5) and the portion where stress is accumulated (the step portions 32 of the first metal film 3) do not overlap each other. As a result, when a plurality of semiconductor devices 1 is manufactured, a number of products in which crack is more likely to occur in the first metal films 3 can be reduced, and product yield of the semiconductor device 1 can be improved. Further, since only the width of the specific interlayer insulation film 7 located under the end 51 of the protective insulation film 5 needs to be adjusted, the performance of the semiconductor device 1 will not be deteriorated.

As above, an embodiment has been described, however, the specific configuration is not limited to the above embodiment. In the description hereinbelow, configurations similar to those of the above description will be given the same reference signs, and the description thereof may be omitted.

Second Embodiment

Figure 4:
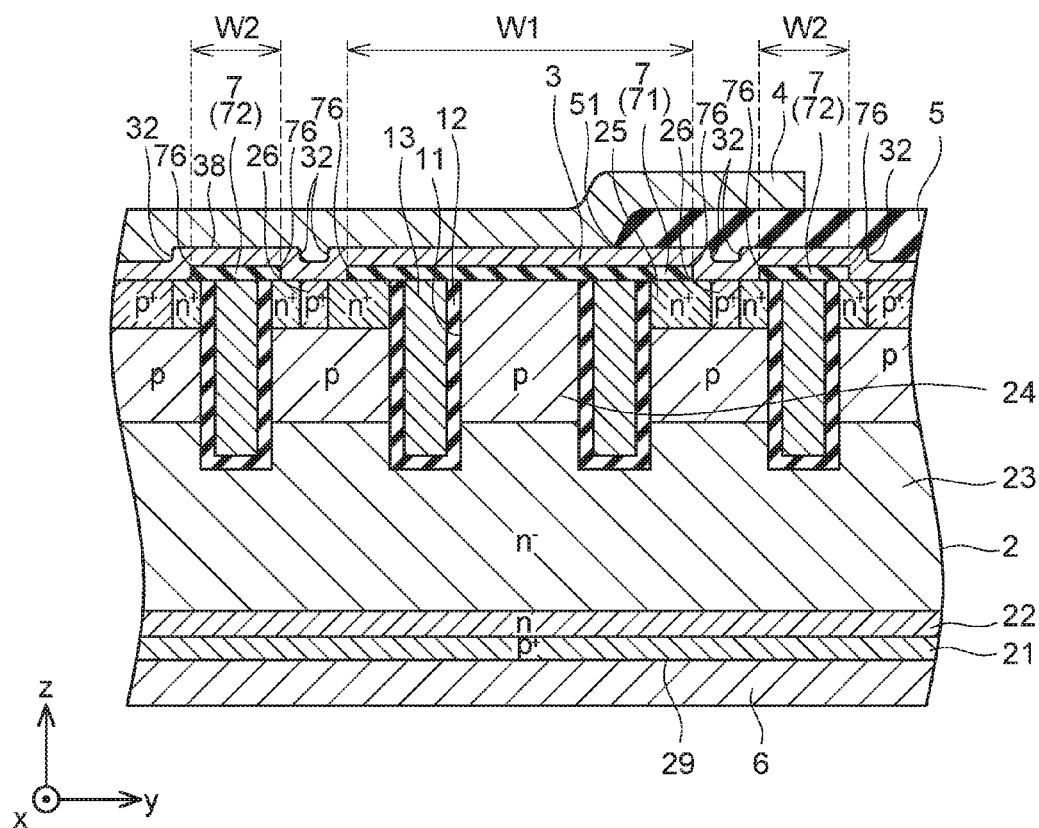
FIG. 4 is a cross sectional view corresponding to FIG. 3 for a semiconductor device of a second embodiment.

In the above embodiment, one wide-width interlayer insulation film 71 covered the front surface of one gate electrode 13, however, no limitation is made hereto. In a second embodiment, as shown in FIG. 4, one wide-width interlayer insulation film 71 covers the front surfaces of a plurality of gate electrodes 13 at the position under the end 51 of the protective insulation film 5. In the present embodiment, one wide-width interlayer insulation film 71 covers the front surfaces of two gate electrodes 13. The wide-width interlayer insulation film 71 is provided to spread over the plurality of gate electrodes 13. The wide-width interlayer insulation film 71 is provided to continuously spread over two adjacent trenches 11 in the direction along which the plurality of trenches 11 is abreast.

According to such a configuration, the width w1 of the specific interlayer insulation film 7 (wide-width interlayer insulation film 71) positioned under the end 51 of the protective insulation film 5 is further widened. Due to this, when the protective insulation film 5 is to be formed, it becomes even easier to form the end 51 of the protective insulation film 5 above the wide-width interlayer insulation film 71. Thus, it becomes easier to form the protective insulation film 5 so that the end 51 of the protective insulation film 5 does not overlap any of the step portions 32 of the first metal film 3. As a result, the production yield of the semiconductor device 1 can further be improved.

Third Embodiment

Figure 5:
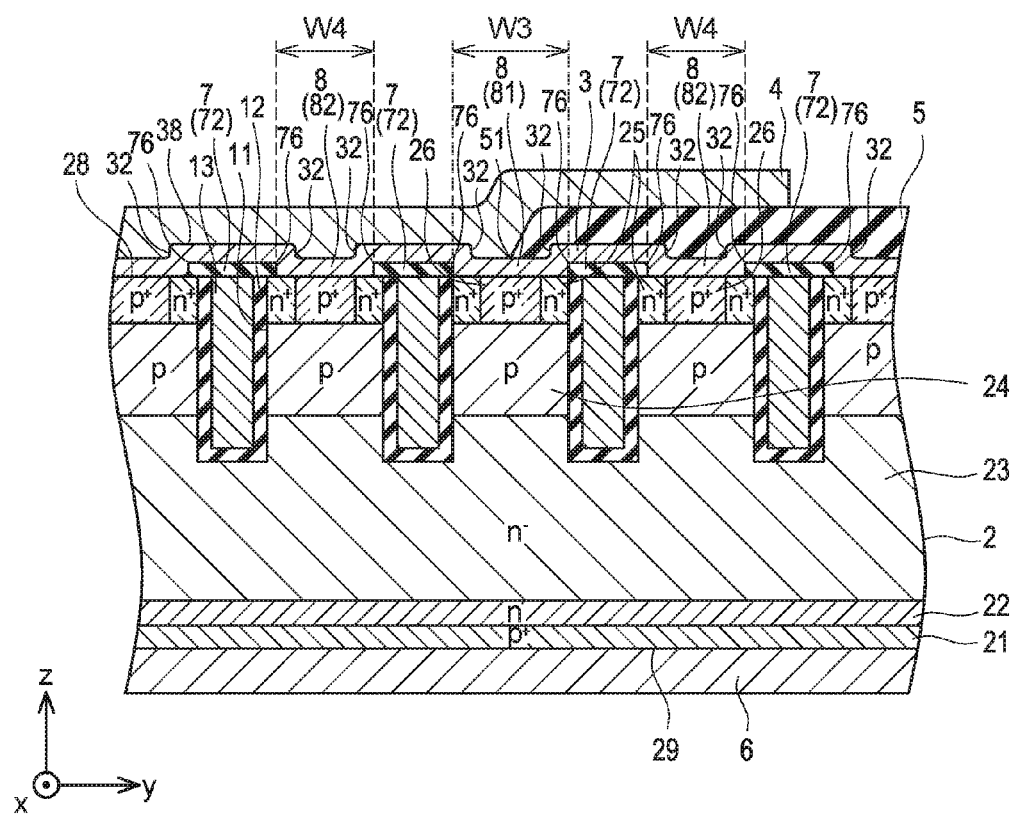
FIG. 5 is a cross sectional view corresponding to FIG. 3 for a semiconductor device of a third embodiment.

In the above embodiments, the end 51 of the protective insulation film 5 was positioned above the specific interlayer insulation film 7 (wide-width interlayer insulation film 71), however, no limitation is made hereto. In a third embodiment, as shown in FIG. 5, the end 51 of the protective insulation film 5 may be positioned above an interval portion 8 between one interlayer insulation film 7 and another interlayer insulation film 7. An interval portion 8 is provided between one interlayer insulation film 7 and another interlayer insulation film 7 that are adjacent each other in the direction along which the plurality of trenches 11 is aligned abreast. A plurality of interval portions 8 is provided along the lateral direction (y direction). An interval portion 8 having a wide width and an interval portion 8 having a narrow width are included among the plurality of interval portions 8. The width refers to a dimension along the direction along which the plurality of trenches 11 is aligned abreast. Among the plurality of interval portions 8, the interlayer interval portion 8 having the wide width may be termed a wide-width interval portion 81, and other interval portions 8 may be termed narrow-width interval portions 82.

In the up and down direction (z direction) of the semiconductor substrate 2, the end 51 of the protective insulation film 5 and the wide-width interval portion 81 overlap each other. A width w3 in the y direction of a specific interval portion 8 (wide-width interval portion 81) positioned under the end 51 of the protective insulation film 5 is wider than a width w4 in the y direction of the other interval portions 8 (narrow-width interval portions 82) (that are not positioned under the end 51 of the protective insulation film 5). Notably, an interval between adjacent trenches 11 is identical to that of the above embodiments. The width of the interval portion 8 is adjusted by adjusting the position of the end 76 of the interlayer insulation film 7.

According to this configuration, it becomes even easier to form the end 51 of the protective insulation film 5 to overlap with the specific interval portion 8 (wide-width interval portion 81) upon the formation of the protective insulation film 5. That is, it becomes easier to form the protective insulation film 5 so that the end 51 of the protective insulation film 5 does not overlap with any of the step portions 32 in the first metal film 3. Thus, it becomes easier to form the protective insulation film 5 while ensuring that the portion where large stress is generated (the end 51 of the protective insulation film 5) and the portion where stress is accumulated (the step portions 32 of the first metal film 3) do not overlap each other. As a result, similar to the first embodiment, the product yield of the semiconductor device 1 can be improved.

Other Embodiments

In the above embodiments, the second metal film 4 covered the portion of the first metal film 3 that is not covered by the protective insulation film 5 as well as the protective insulation film 5, however, no limitation is made hereto. In another embodiment, the second metal films 4 may not be present. Even if the second metal films 4 are not present, larger thermal stress is generated in the end 51 of the protective insulation film 5 than in other parts.

Specific examples of the present disclosure has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations.

1. The one interlayer insulation film that is under the end of the protective insulation film may spread over two or more gate electrodes.

According to such a configuration, the length that can be seen in a cross sectional view between the ends of the interlayer insulation film positioned becomes wider, and the diameter of the step portion of the first metal film becomes wider. Due to this, it becomes easier to provide the protective insulation film at the position where the end of the protective insulation film does not overlap with any of the step portions of the first metal film. As a result, the production yield of the semiconductor device can further be improved.

2. The semiconductor device disclosed herein may comprise a semiconductor substrate; a plurality of trenches provided abreast on a front surface of the semiconductor substrate; a plurality of gate insulation films, each gate insulation film covering an inner surface of a corresponding one of the trenches; a plurality of gate electrodes, each gate electrode being provided in the corresponding trench and insulated from the semiconductor substrate by a corresponding one of the gate insulation films; and a plurality of interlayer insulation films, each interlayer insulation film covering a front surface of a corresponding one of the gate electrodes and protruding from the front surface of the semiconductor substrate. Further, the semiconductor device comprises a metal film covering the front surface of the semiconductor substrate and plurality of the interlayer insulation films; and a protective insulation film covering a part of the metal film. In a cross-section traversing the plurality of trenches, an end of the protective insulation film may be above an interval portion between two adjacent ones of the interlayer insulation films. A width of the interval below the end of the protective insulation film may be wider than widths of other interval portions.

According to such a configuration, the length of the interval portion between the adjacent interlayer insulation films positioned under the end of the protective insulation film is wide, so the diameter of the step portion formed at the portion covering both ends of the adjacent interlayer insulation films in the first metal film covering the interlayer insulation film becomes larger. Due to this, it becomes easy to locate the end of the protective insulation film on the portion between the step portions of the first metal film upon forming the protective insulation film covering the first metal film. That is, it becomes easier to form the protective insulation film so that the end of the protective insulation film does not overlap with any of the step portions of the first metal film. Thus, it becomes easier to form the protective insulation film while ensuring that the portion where the large stress is generated and the portion where the stress is accumulated are not overlapped. As a result, when a plurality of semiconductor devices is manufactured, a product in which crack is more likely to occur in the first metal film can be reduced, and the product yield of the semiconductor device can be improved.

What is claimed is:

1. A semiconductor device comprising:
a semiconductor substrate;
a plurality of trenches provided abreast on a front surface of the semiconductor substrate;
a plurality of gate insulation films, each gate insulation film covering an inner surface of a corresponding one of the trenches;
a plurality of gate electrodes, each gate electrode being provided in the corresponding trench and insulated from the semiconductor substrate by a corresponding one of the gate insulation films;
a plurality of interlayer insulation films, each interlayer insulation film covering a front surface of a corresponding one of the gate electrodes and protruding from the front surface of the semiconductor substrate;
a metal film covering the front surface of the semiconductor substrate and plurality of the interlayer insulation films; and
a protective insulation film covering a part of the metal film,
wherein
in a cross-section traversing the plurality of trenches, an end of the protective insulation film is above one of the interlayer insulation films, and a width of the one of the interlayer insulation films that is below the end of the protective insulation film is wider than widths of other interlayer insulation films.

2. The semiconductor device according to claim 1, wherein
the one of the interlayer insulation films that is below the end of the protective insulation film is provided over some of the plurality of the gate electrodes.

3. A semiconductor device comprising:
a semiconductor substrate;
a plurality of trenches provided abreast on a front surface of the semiconductor substrate;
a plurality of gate insulation films, each gate insulation film covering an inner surface of a corresponding one of the trenches;
a plurality of gate electrodes, each gate electrode being provided in the corresponding trench and insulated from the semiconductor substrate by a corresponding one of the gate insulation films;
a plurality of interlayer insulation films, each interlayer insulation film covering a front surface of a corresponding one of the gate electrodes and protruding from the front surface of the semiconductor substrate;
a metal film covering the front surface of the semiconductor substrate and plurality of the interlayer insulation films; and
a protective insulation film covering a part of the metal film,
wherein
in a cross-section traversing the plurality of trenches, an end of the protective insulation film is above an interval portion between two adjacent ones of the interlayer insulation films, and a width of the interval portion below the end of the protective insulation film is wider than widths of other interval portions.

* * * * *